United States Patent
Shigeta et al.

(10) Patent No.: US 10,023,797 B2
(45) Date of Patent: *Jul. 17, 2018

(54) LIQUID COMPOSITION FOR ETCHING OXIDES COMPRISING INDIUM, ZINC, TIN, AND OXYGEN AND ETCHING METHOD

(71) Applicant: MITSUBISHI GAS CHEMICAL COMPANY, INC., Tokyo (JP)

(72) Inventors: Mari Shigeta, Tokyo (JP); Kunio Yube, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/116,626

(22) PCT Filed: Jan. 21, 2015

(86) PCT No.: PCT/JP2015/051498
§ 371 (c)(1),
(2) Date: Aug. 4, 2016

(87) PCT Pub. No.: WO2015/122250
PCT Pub. Date: Aug. 20, 2015

(65) Prior Publication Data
US 2016/0348001 A1    Dec. 1, 2016

(30) Foreign Application Priority Data

Feb. 17, 2014 (JP) .................................. 2014-027293

(51) Int. Cl.
*C09K 13/06* (2006.01)
*C09K 13/04* (2006.01)
*G02F 1/1343* (2006.01)
*H01L 33/00* (2010.01)
*H01L 33/36* (2010.01)
*H01L 21/306* (2006.01)

(52) U.S. Cl.
CPC .............. *C09K 13/06* (2013.01); *C09K 13/04* (2013.01); *G02F 1/13439* (2013.01); *H01L 33/005* (2013.01); *H01L 33/36* (2013.01); *H01L 21/30604* (2013.01)

(58) Field of Classification Search
CPC ...... C09K 13/04; C09K 13/06; G02F 1/13439; H01L 33/005; H01L 33/136; H01L 21/30604; H01L 21/30617

USPC .... 252/79.1, 79.2, 79.3, 79.4; 438/691, 692, 438/693, 745, 750

See application file for complete search history.

(56) References Cited

U.S. PATENT DOCUMENTS

| | | | |
|---|---|---|---|
| 6,533,965 B1 | 3/2003 | Sasaki et al. | |
| 2004/0144755 A1* | 7/2004 | Motonari | C09G 1/02 216/88 |
| 2006/0043332 A1 | 3/2006 | Cho et al. | |
| 2008/0038188 A1 | 2/2008 | Ohnishi et al. | |
| 2010/0170696 A1 | 7/2010 | Yano et al. | |
| 2011/0049088 A1* | 3/2011 | Matsubara | C09K 13/00 216/13 |
| 2012/0205620 A1* | 8/2012 | Sato | H01L 33/32 257/13 |
| 2012/0238047 A1* | 9/2012 | Bawendi | B82Y 20/00 438/46 |
| 2014/0295626 A1* | 10/2014 | Park | C23F 1/18 438/151 |

FOREIGN PATENT DOCUMENTS

| | | |
|---|---|---|
| JP | 2001-155549 | 6/2001 |
| JP | 2006-77241 | 3/2006 |
| JP | 2007-63649 | 3/2007 |
| JP | 2008-013795 | 1/2008 |
| JP | 2009-218513 | 9/2009 |
| JP | 2009-235438 | 10/2009 |
| JP | 2014-130917 | 7/2014 |
| JP | 2014-146715 | 8/2014 |
| WO | 2006/006497 | 1/2006 |
| WO | 2008/032728 | 3/2008 |

OTHER PUBLICATIONS

Search Report issued in Japanese Patent Application No. PCT/JP2015/051498, dated Apr. 7, 2015.

* cited by examiner

*Primary Examiner* — Lan Vinh
(74) *Attorney, Agent, or Firm* — Greenblum & Bernstein, PLC

(57) ABSTRACT

Provided is a liquid etching composition that etches an oxide comprising indium, zinc, tin and oxygen at a preferable etching rate, without the etching rate being changed much along with the dissolution of the oxide, and with no substantial generation of deposit, and corrodes wiring materials at such a low level to be ignorable. The present invention uses a liquid etching composition comprising (A) at least one selected from the group consisting of sulfuric acid, methanesulfonic acid, and a salt of any of these acids; and water; the liquid etching composition having a pH value of −1 to 3.

9 Claims, No Drawings

LIQUID COMPOSITION FOR ETCHING OXIDES COMPRISING INDIUM, ZINC, TIN, AND OXYGEN AND ETCHING METHOD

TECHNICAL FIELD

The present invention relates to a liquid etching composition for etching an oxide containing indium, zinc, tin and oxygen that is usable for a display device such as a liquid crystal display (LCD) device, an electroluminescence display (LED) device or the like, and an etching method using the same.

BACKGROUND ART

For a semiconductor layer in a display device such as a liquid crystal display device, an electroluminescence display device or the like, amorphous silicon or low-temperature polysilicon is widely used. Along with realization of a larger size of display screen, display of higher definition, lower power consumption and the like, various oxide semiconductor materials have been developed.

An example of oxide semiconductor materials is indium-gallium-zinc-oxide (IGZO), which has characteristics of a high electron mobility, a small leak current and the like. Oxide semiconductor materials of various compositions that have been studied as having characteristics superior to those of IGZO include indium-gallium-oxide (IGO), gallium-zinc-oxide (GZO), zinc-tin-oxide (ZTO), indium-zinc-tin-oxide (IZTO), indium-gallium-zinc-tin-oxide (IGZTO) and the like.

In general, an oxide semiconductor material is applied onto a substrate formed of glass or the like by use of a film formation process of sputtering or the like and thus is formed into a thin film. Next, the resultant thin film is etched by use of a resist or the like as a mask, so that an electrode pattern is formed. The etching step may be performed by a wet method or a dry method. The wet method uses a liquid etching composition.

Among oxide semiconductor materials, an oxide containing indium, zinc, tin and oxygen has a superb chemical resistance, and thus is stable even when being exposed to various chemicals or various types of gas in steps of forming other films of other materials or in an etching step. However, such an oxide containing indium, zinc, tin and oxygen has a problem of being difficult to be processed by wet etching or the like.

A liquid etching composition that is used to form a pattern of an oxide semiconductor material by wet etching needs to have the following properties (1) through (5):

(1) Has a preferable etching rate (E.R.);
(2) Does not have the etching rate changed much when dissolving the oxide; namely, is stably usable for a long time and has a long life as a liquid chemical;
(3) Generates no deposit when dissolving the oxide;
(4) Does not leave much etching residue; and
(5) Does not corrode materials of wirings or other peripheral members.

The etching rate on an oxide semiconductor material is preferably 10 nm/min. or higher, more preferably 20 nm/min. or higher, and still more preferably 30 nm/min. or higher. The etching rate on an oxide semiconductor material is preferably 10000 nm/min. or lower, more preferably 5000 nm/min. or lower, and still more preferably 2000 nm/min. or lower. Among these ranges, 10 to 10000 nm/min. is preferable, 20 to 5000 nm/min. is more preferable, and 30 to 2000 nm/min. is still more preferable. When the etching rate is 10 to 10000 nm/min., the production efficiency is kept high and the etching operation is performed stably.

It is also preferable that when an oxide semiconductor material is dissolved in a liquid etching composition as the wet etching progresses, the etching rate is not changed much. This is very important for efficient industrial production in the case where a liquid etching composition is used for etching an oxide semiconductor material.

When deposit is generated in a liquid etching composition having an oxide semiconductor material dissolved therein, there is a possibility that the deposit is left as residue on the post-etching substrate. The residue may generate voids, cause insufficient adhesiveness, cause electricity leakage or wire breakage in various film formation steps after the dissolution. Any of these may result in insufficient characteristics of the display device. It is preferable that there is not much residue on the post-etching substrate.

When deposit is generated in a liquid etching composition having an oxide semiconductor material dissolved therein, the deposit may clog a filter provided for circulating the liquid etching composition. Filter exchange is a complicated process and may raise the cost. This requires the liquid etching composition to be disposed of before the deposit is generated even if the liquid etching composition is still usable. This shortens the period in which each liquid etching composition is usable and thus raises the cost of liquid etching compositions. In addition, the cost of processing the liquid waste is also raised.

For example, it is assumed that a liquid etching composition containing general oxalic acid (not containing component A described below) is used to etch an oxide semiconductor material containing zinc. In this case, there is a serious problem that zinc oxalate is deposited as a solid substance. In the case of a liquid etching composition containing general oxalic acid, the deposit is generated when zinc dissolved in the liquid etching composition has a concentration of about 10 ppm by mass.

Therefore, the liquid etching composition is required to generate no deposit even when an oxide containing zinc is dissolved therein. Specifically, zinc dissolved in the liquid etching composition has a concentration of preferably 10 ppm by mass or higher. Zinc dissolved in the liquid etching composition has a concentration of more preferably 100 ppm by mass or higher, and especially preferably 1000 ppm by mass or higher.

There is no specific upper limitation on the concentration of zinc. However, for a stable etching operation, zinc has a concentration of preferably 5000 ppm by mass or lower, more preferably 4000 ppm by mass or lower, and especially preferably 3000 ppm by mass or lower.

In general, wiring materials used in a display device such as a liquid crystal display device or the like are formed of copper (Cu), aluminum (Al), molybdenum (Mo), titanium (Ti) or the like. There is a possibility that a liquid etching composition contacts such wiring materials during the etching performed on an oxide semiconductor material. Therefore, it is preferable that the liquid etching composition has a low level of corrosiveness on the wiring materials. The liquid etching composition has a specific etching rate on the wiring materials of preferably 3 nm/min. or lower, more preferably 2 nm/min. or lower, and especially preferably 1 nm/min. or lower.

Patent Document 1 (Japanese Laid-Open Patent Publication No. 2001-155549) describes that indium-zinc-tin-oxide (IZTO) is etchable with hydrochloric acid.

Patent Document 2 (Japanese Laid-Open Patent Publication No. 2007-63649) describes that indium-zinc-tin-oxide (IZTO) is etchable with an aqueous solution of oxalic acid.

Patent Document 3 (Japanese Laid-Open Patent Publication No. 2006-77241) discloses a liquid etching composition usable for indium-zinc-oxide (IZO) or indium-tin-oxide (ITO). This liquid etching composition contains sulfuric acid as an oxidizer, a compound selected from phosphoric acid, nitric acid, acetic acid, perchloric acid, hydrogen peroxide, persulfate and the like as an assisting oxidizer, ammonium salt as an etching suppressor, and water.

Patent Document 4 (Japanese Laid-Open Patent Publication No. 2009-218513) discloses a liquid etching composition usable for indium-tin-oxide (ITO). This liquid etching composition contains sulfuric acid, a surfactant, and water.

Patent Document 5 (WO2008/32728) discloses a liquid etching composition usable for indium-tin-oxide (ITO). This liquid etching composition contains (a) oxalic acid, (b) naphthalenesulfonic acid condensate or a salt thereof, (c) at least one of hydrochloric acid, sulfuric acid, water-soluble amine, and a salt of any of these, and (d) water.

CITATION LIST

Patent Literature

Patent Document 1: Japanese Laid-Open Patent Publication No. 2001-155549
Patent Document 2: Japanese Laid-Open Patent Publication No. 2007-63649
Patent Document 3: Japanese Laid-Open Patent Publication No. 2006-77241
Patent Document 4: Japanese Laid-Open Patent Publication No. 2009-218513
Patent Document 5: WO2008/32728

SUMMARY OF INVENTION

Technical Problem

Hydrochloric acid, which is disclosed in Patent Document 1, may undesirably corrode the wiring materials (see comparative example 1).

An aqueous solution of oxalic acid, which is disclosed in Patent Document 2, may undesirably result in oxalate being deposited (see comparative example 2).

None of Patent Documents 3, 4 and 5 describes etching characteristics on indium-zinc-tin-oxide (IZTO).

Therefore, it is desired to provide a liquid etching composition which has a preferable etching rate on an oxide containing indium, zinc, tin and oxygen, does not have the etching rate changed much when dissolving an oxide containing indium, zinc, tin and oxygen, generates no deposit when dissolving an oxide containing indium, zinc, tin and oxygen, and does not corrode much wiring materials such as copper, aluminum, molybdenum, titanium and the like.

Solution to Problem

As a result of performing active studies for solving the above-described problems, the present inventors have found that the above-described object is achieved by a liquid etching composition for etching an oxide containing indium, zinc, tin and oxygen, the liquid etching composition including (A) at least one selected from the group consisting of sulfuric acid, methanesulfonic acid, and a salt of any of these acids, and water, and having a pH value of −1 to 3.

Namely, the present invention is as follows.

1. A liquid etching composition for etching an oxide containing indium, zinc, tin and oxygen, the liquid etching composition comprising:
(A) at least one selected from the group consisting of sulfuric acid, methanesulfonic acid, and a salt of any of these acids; and water; the liquid etching composition having a pH value of −1 to 3.

2. The liquid etching composition according to item 1, further comprising (B) carboxylic acid.

3. The liquid etching composition according to item 2, wherein the (B) carboxylic acid is at least one selected from the group consisting of oxalic acid, acetic acid, glycolic acid, malonic acid, maleic acid, succinic acid, malic acid, tartaric acid, glycine, and citric acid.

4. The liquid etching composition according to item 1, further comprising a (C) polysulfonic acid compound.

5. The liquid etching composition according to item 4, wherein the (C) polysulfonic acid compound is at least one selected from the group consisting of formalin condensate of naphthalenesulfonic acid, a salt thereof, polyoxyethylene-alkylethersulfuric acid, and polyoxyethylenealkylphenylethersulfuric acid.

6. The liquid etching composition according to item 1, further comprising 10 to 5000 ppm by mass of (D) zinc.

7. A method for etching an oxide containing indium, zinc, tin and oxygen, the method comprising putting a liquid etching composition into contact with a substrate provided with an oxide containing indium, zinc, tin and oxygen, the liquid etching composition containing 0.5 to 30% by mass of (A) at least one selected from the group consisting of sulfuric acid, methanesulfonic acid, and a salt of any of these acids, and water (remaining part), the liquid etching composition having a pH value of −1 to 3.

8. The method for etching according to item 7, wherein the liquid etching composition further contains 0.1 to 15% by mass of (B) carboxylic acid.

The (B) carboxylic acid is at least one selected from the group consisting of oxalic acid, acetic acid, glycolic acid, malonic acid, maleic acid, succinic acid, malic acid, tartaric acid, glycine, and citric acid.

9. The method for etching according to item 7, wherein the liquid etching composition further contains 0.0001 to 10% by mass of (C) polysulfonic acid compound.

The (C) polysulfonic acid compound is at least one selected from the group consisting of formalin condensate of naphthalenesulfonic acid, a salt thereof, polyoxyethylene-alkylethersulfuric acid, and polyoxyethylenealkylphenylethersulfuric acid.

10. The method for etching according to item 7, wherein the liquid etching composition further contains 10 to 5000 ppm by mass of (D) zinc.

11. A display device produced by the method for etching according to item 7.

According to an especially preferable embodiment of the present invention, a liquid etching composition for etching an oxide containing indium, zinc, tin and oxygen according to the present invention contains (A) at least one selected from the group consisting of sulfuric acid, methanesulfonic acid, and a salt of any of these acids, 10 to 5000 ppm by mass of (D) zinc, and water; and has a pH value of −1 to 3.

The liquid etching composition according to the present invention preferably further include (B) carboxylic acid. The (B) carboxylic acid is preferably at least one selected from the group consisting of oxalic acid, acetic acid, glycolic acid, malonic acid, maleic acid, succinic acid, malic acid, tartaric acid, glycine, and citric acid.

The liquid etching composition according to the present invention preferably further contains a (C) polysulfonic acid compound. The (C) polysulfonic acid compound is preferably at least one selected from the group consisting of formalin condensate of naphthalenesulfonic acid, a salt thereof, polyoxyethylenealkylethersulfuric acid, and polyoxyethylenealkylphenylethersulfuric acid.

According to an especially preferable embodiment of the present invention, a method according to the present invention includes putting a liquid etching composition into contact with a substrate provided with an oxide containing indium, zinc, tin and oxygen to etch the oxide containing indium, zinc, tin and oxygen, the liquid etching composition containing 0.5 to 30% by mass of (A) at least one selected from the group consisting of sulfuric acid, methanesulfonic acid, and a salt of any of these acids, 10 to 5000 ppm by mass of (D) zinc, and water (remaining part), the liquid etching composition having a pH value of −1 to 3.

In the method according to the present invention, the liquid etching composition preferably further contains 0.1 to 15% by mass of (B) carboxylic acid. The (B) carboxylic acid is preferably at least one selected from the group consisting of oxalic acid, acetic acid, glycolic acid, malonic acid, maleic acid, succinic acid, malic acid, tartaric acid, glycine, and citric acid.

In the method according to the present invention, the liquid etching composition preferably further contains 0.0001 to 10% by mass of (C) polysulfonic acid compound. The (C) polysulfonic acid compound is preferably at least one selected from the group consisting of formalin condensate of naphthalenesulfonic acid, a salt thereof, polyoxyethylenealkylethersulfuric acid, and polyoxyethylenealkylphenylethersulfuric acid.

Advantageous Effects of Invention

According to a preferable embodiment of the present invention, a liquid etching composition according to the present invention is used to etch an oxide containing indium, zinc, tin and oxygen. As a result, the etching rate is preferable, the pattern shape is superb, the etching rate is not changed much along with the dissolution of the oxide containing indium, zinc, tin and oxygen, no deposit is generated, and the corrosiveness on wiring materials is small. Therefore, the etching operation is performed stably for a long time.

DESCRIPTION OF EMBODIMENTS

An oxide containing indium, zinc, tin and oxygen (IZTO) that is etchable by a liquid etching composition according to the present invention may be any oxide containing indium, zinc, tin and oxygen with no specific limitation. Such an oxide may contain at least one element, in a trace amount, other than indium, zinc and tin.

Indium, zinc and tin are each contained in the oxide at a content of preferably 1% by mass or higher, more preferably 3% by mass or higher, and still more preferably 10% by mass or higher.

A liquid etching composition according to the present invention contains (A) at least one selected from the group consisting of sulfuric acid, methanesulfonic acid, and a salt of any of these acids; and water; and has a pH value of −1 to 3.

A liquid etching composition according to the present invention contains at least one selected from the group consisting of sulfuric acid, methanesulfonic acid, and a salt of any of these acids as component (A). Specifically, component (A) is preferably sulfuric acid, fuming sulfuric acid, ammonium sulfate, ammonium hydrogen sulfate, sodium hydrogen sulfate, potassium hydrogen sulfate, methanesulfonic acid or the like, is more preferably sulfuric acid or methanesulfonic acid, and is especially preferably sulfuric acid. The acid or a salt thereof selected as component (A) is contained at a concentration, as being converted into a concentration of acid, of preferably 0.5% by mass or higher, more preferably 1% by mass or higher, and still more preferably 2% by mass or higher. The acid or a salt thereof selected as component (A) is contained at a concentration, as converted into a concentration of acid, of preferably 30% or mass or lower, more preferably 20% by mass or lower, and still more preferably 15% by mass or lower. Among these ranges, 0.5 to 30% by mass is preferable, 1 to 20% by mass is more preferable, and 2 to 15% by mass is still more preferable. When the concentration is 0.5 to 30% by mass, a good etching rate is obtained.

Water usable in the present invention is preferably derived of metal ions, organic impurities, particles and the like by distillation, ion exchange, filtering, any of various adsorption processes, or the like. Especially, pure water or ultrapure water is preferable. The water is contained at a concentration of preferably 10% by mass or higher, more preferably 20% by mass or higher, and still more preferably 30% by mass or higher. In such a case, the concentration of water is of a part that is left after various chemicals are removed.

The liquid etching composition according to the present invention has a pH value of −1 to 3. The liquid etching composition according to the present invention has a pH value of more preferably −0.7 to 2 and still more preferably −0.5 to 1.

The liquid etching composition according to the present invention may optionally contain a pH adjusting agent. The pH adjusting agent may be of any type with no specific limitation as long as not influencing the etching performance. The pH value may be adjusted by use of sulfuric acid or methanesulfonic acid acting as component (A) or carboxylic acid acting as component (B) described below. As the pH adjusting agent, ammonia water, amide sulfuric acid or the like may be used.

The liquid etching composition according to the present invention may optionally contain carboxylic acid as component (B).

Specifically, the carboxylic acid may be of any type with no specific limitation as long as supplying carboxylic acid ion. Carboxylic acid ion has a function of improving the stability of the liquid etching composition for etching an oxide containing indium, zinc, tin and oxygen to adjust the etching rate. The carboxylic acid may be preferably, for example, aliphatic carboxylic acid having a carbon number of 1 to 18, aromatic carboxylic acid having a carbon number of 6 to 10, amino acid having a carbon number of 1 to 10, or the like.

Preferable examples of the aliphatic carboxylic acid having a carbon number of 1 to 18 include oxalic acid, formic acid, acetic acid, propionic acid, lactic acid, glycolic acid, diglycolic acid, pyruvic acid, malonic acid, butylic acid, hydroxybutylic acid, tartaric acid, succinic acid, malic acid, maleic acid, fumaric acid, valeric acid, glutaric acid, itaconic acid, caproic acid, adipic acid, citric acid, propanetricarboxylic acid, trans-aconitic acid, enanthic acid, caprylic acid, lauric acid, myristic acid, palmitic acid, stearic acid, oleic acid, linoleic acid, linolenic acid, and a salt of any of acids.

More preferable examples of the carboxylic acid among these acids and salts include oxalic acid, acetic acid, glycolic acid, lactic acid, malonic acid, maleic acid, succinic acid, malic acid, tartaric acid, citric acid, and a salt of any of acids. Especially preferable examples include oxalic acid, acetic acid, maleic acid, malic acid, and citric acid. These acids and salts may be used independently or in any combination.

The carboxylic acid or a salt thereof as component (B) is contained at a concentration, as being converted into a concentration of carboxylic acid, of preferably 0.1% by mass or higher, more preferably 1% by mass or higher, and still more preferably 3% by mass or higher. The carboxylic acid or a salt thereof as component (B) is contained at a concentration, as converted into a concentration of carboxylic acid, of preferably 15% or mass or lower, more preferably 12% by mass or lower, and still more preferably 10% by mass or lower. Among these ranges, 0.1 to 15% by mass is preferable, 1 to 12% by mass is more preferable, and 3 to 10% by mass is still more preferable. When the concentration is 0.1 to 15% by mass, the level of corrosion on wiring materials is suppressed low.

The liquid etching composition according to the present invention may optionally contain a polysulfonic acid compound as component (C). Preferable examples of the polysulfonic acid compound include formalin condensate of naphthalenesulfonic acid, a salt thereof, polyoxyethylenealkylethersulfuric acid, polyoxyethylenealkylphenylethersulfuric acid, and the like. The formalin condensate of naphthalenesulfonic acid is commercially available under the trade names of Demol N (Kao Corporation), LAVELIN FP (Dai-ichi Kogyo Seiyaku Kabushiki Kaisha), Polity N100K (Lion Corporation) and the like.

The polysulfonic acid compound as component (C) is contained at a concentration of preferably 0.0001% by mass or higher and more preferably 0.001% by mass or higher. The polysulfonic acid compound as component (C) is contained at a concentration of preferably 10% by mass or lower and more preferably 5% by mass or lower. Among these ranges, 0.0001 to 10% by mass is preferable, and 0.001 to 5% by mass is more preferable. When the concentration is 0.0001 to 10% by mass, a good residue removal property is obtained.

The liquid etching composition according to the present invention generates no deposit or does not cause the etching rate to be changed even when a zinc component is dissolved therein. According to the present invention, the liquid etching composition may optionally contain zinc as component (D). Zinc has a function of further suppressing the change in the etching rate when an oxide containing indium, zinc, tin and oxygen is dissolved. Zinc may be of any type with no specific limitation as long as supplying zinc ion. Specifically, a salt such as zinc sulfate, zinc nitrate, zinc chloride or the like may be used, or zinc (metal), indium-zinc-tin-oxide or zinc oxide may be dissolved.

Zinc as component (D) is contained at a concentration of preferably 10 ppm by mass or higher, more preferably 100 ppm by mass or higher, and still more preferably 1000 ppm by mass or higher. Zinc as component (D) is contained at a concentration of preferably 5000 ppm by mass or lower, more preferably 4000 ppm by mass or lower, and still more preferably 3000 ppm by mass or lower. Among these ranges, 10 to 5000 ppm by mass is preferable, 100 to 4000 ppm by mass is more preferable, and 1000 to 3000 ppm by mass is still more preferable. When the concentration is 10 to 5000 ppm by mass, the change in the etching rate is still smaller.

The liquid etching composition according to the present invention may contain, in addition to, or instead of, any of the above-described components, various additives that are commonly used for a liquid etching composition at such a content that does not harm the effect of the liquid etching composition. For example, a solvent, a pH buffering agent or the like may be used.

According to an etching method according to the present invention, an oxide containing indium, zinc, tin and oxygen (IZTO) is a target of etching.

The etching method according to the present invention includes the step of putting a liquid etching composition according to the present invention into contact with an etching target, the liquid etching composition according to the present invention containing (A) at least one selected from the group consisting of sulfuric acid, methanesulfonic acid, and a salt of any of these acids, and water, and having a pH value of −1 to 3. Preferably, the liquid etching composition contains (A) at least one selected from the group consisting of sulfuric acid, methanesulfonic acid, and a salt of any of these acids, 10 to 5000 ppm by mass of (D) zinc, and water, and has a pH value of −1 to 3. Preferably, the liquid etching composition contains (A) at least one selected from the group consisting of sulfuric acid, methanesulfonic acid, and a salt of any of these acids, (B) at least one carboxylic acid selected from the group consisting of oxalic acid, acetic acid, glycolic acid, malonic acid, maleic acid, succinic acid, malic acid, tartaric acid, glycine, and citric acid, 10 to 5000 ppm by mass of (D) zinc, and water, and has a pH value of −1 to 3. More preferably, the liquid etching composition contains 0.5 to 30% by mass of (A) at least one selected from the group consisting of sulfuric acid, methanesulfonic acid, and a salt of any of these acids, 10 to 5000 ppm by mass of (D) zinc, and water (remaining part), and has a pH value of −1 to 3. More preferably, the liquid etching composition contains 0.5 to 30% by mass of (A) at least one selected from the group consisting of sulfuric acid, methanesulfonic acid, and a salt of any of these acids, 0.1 to 15% by mass of (B) at least one carboxylic acid selected from the group consisting of oxalic acid, acetic acid, glycolic acid, malonic acid, maleic acid, succinic acid, malic acid, tartaric acid, glycine, and citric acid, 10 to 5000 ppm by mass of (D) zinc, and water (remaining part), and has a pH value of −1 to 3. In one embodiment according to the present invention, the liquid etching composition preferably further contains 0.0001 to 10% by mass of (C) polysulfonic acid compound. The (C) polysulfonic acid compound is preferably at least one selected from the group consisting of formalin condensate of naphthalenesulfonic acid, a salt thereof, polyoxyethylenealkylethersulfuric acid, and polyoxyethylenealkylphenylethersulfuric acid.

The etching method according to the present invention prevents generation of deposit even when an etching operation is performed continuously. Since the change in the etching rate is small, the etching operation is performed stably for a long time.

With the etching method according to the present invention, there is no specific limitation on the shape of the etching target. In the case where the etching target is a semiconductor material in a flat panel display, the etching target is preferably a thin film. For example, it is assumed that a thin film of an oxide containing indium, zinc, tin and oxygen is formed on an insulating film of silicon oxide, a resist is applied thereon, and a mask having a desirable pattern is transferred thereon by exposure and developed to form a desirable resist pattern. The resultant structure is an etching target. In the case where the etching target is a thin film, the thin film preferably has a thickness of 1 to 1000 nm. The thin film has a thickness of more preferably 5 to 500 nm, and especially preferably 10 to 300 nm. The etching target may have a stacking structure including two or more thin films having different compositions. In this case, the etching target having a stacking structure including two or more thin films having different compositions may be etched in the same step.

The contact temperature of the etching target and the liquid etching composition (namely, the temperature of the liquid etching composition when the liquid etching composition contacts the etching target) is preferably 10° C. or higher, more preferably 15° C. or higher, and still more preferably 20° C. or higher. The contact temperature is preferably 70° C. or lower, more preferably 60° C. or lower, and still more preferably 50° C. or lower. Especially, 10 to 70° C. is preferable, 15 to 60° C. is more preferable, and 20 to 50° C. is still especially preferable. When the contact temperature is 10 to 70° C., a good etching rate is obtained. An etching operation performed in the above-described temperature range suppresses the device from being corroded. When the temperature of the liquid etching composition is raised, the etching rate is increased but the concentrations of the components in the liquid etching composition are changed more due to, for example, vaporization of water. In consideration of this and other factors, a preferable processing temperature may be determined.

With the etching method according to the present invention, there is no specific limitation on the etching time duration. Usually, a just etching time duration until etching of an oxide containing indium, zinc, tin and oxygen is completed to expose an underlying film is preferably 0.01 to 30 minutes, more preferably 0.03 to 10 minutes, still more preferably 0.5 to 5 minutes, and especially preferably 0.1 to 2 minutes.

There is no specific limitation on the method for putting the liquid etching composition into contact with the etching target. A common wet etching method is usable such as a method of putting the liquid etching composition into contact with the etching target by dripping (single-wafer spinning process), spraying or the like, a method of immersing the target in the liquid etching composition, or the like.

EXAMPLES

Hereinafter, embodiments of the present invention and effects thereof will be specifically described by way of examples and comparative examples. The present invention is not limited to any of the following examples.

Measurement of pH Value

An electrode was immersed in the liquid etching composition that was being stirred, and the pH value was measured at 22° C. by use of a pH/ION meter produced by Horiba, Ltd. The pH value of the pH measurement device was calibrated by use of standard solutions having pH values of 2 and 7.

Observation of SEM Image

An SEM image was observed by a field emission-type scanning electron microscope, S-5000H produced by Hitachi High-Technologies Corporation. The observation was performed under the conditions of an acceleration voltage of 2.0 kV, an extraction voltage of 4.2 kV, and an emission current of 10 µA.

Formation of Indium-Zinc-Tin-Oxygen (IZTO) Thin Film/Glass Substrate

Indium oxide, zinc oxide and tin oxide were pulverized, mixed and sintered to form an indium-zinc-tin-oxide target. The target was used to form an indium-zinc-tin-oxide thin film (thickness: 50 nm) having an atomic ratio of indium:zinc:tin of 60:25:15 by sputtering on a glass substrate.

Formation of Indium-Zinc-Tin-Oxygen Thin Film with Resist Pattern/Glass Substrate On the indium-zinc-tin-oxide thin film formed above, a photoresist was applied, exposed and developed to form a resist pattern. Thus, an indium-zinc-tin-oxide thin film with a resist pattern was formed on the substrate.

Evaluation (Determination)

1. Measurement of Etching Rate

The indium-zinc-tin-oxide (IZTO) thin film (thickness: 50 nm) formed on the glass substrate was etched with each of the liquid etching compositions shown in Tables 1 and 2. The etching process was performed as follows. The IZTO thin film/glass substrate was immersed in the liquid etching composition kept at 35° C. for 20 seconds to 60 seconds, and then was washed with pure water and dried.

The thickness of the IZTO thin film was measured before and after the etching process by an optical film thickness measurement device, n & k Analyzer 1280 (produced by n & k Technology Inc.). The difference between the thickness before the etching process and the thickness after the etching process was divided by the etching time duration to find the etching rate. The result was evaluated by the following criteria. The liquid etching composition evaluated as E, G or F was determined to pass the test.

E: etching rate: 30 nm/min.-200 nip/min.

G: etching rate: 20 nm/min.-lower than 30 nm/min., or 201 nm/min.-500 Dm/min.

F: etching rate: 10 nm/min.-lower than 20 nm/min., or 501 nm/min.-1000 nm/min.

P: etching rate: lower than 10 Dm/min., or 1001 nm/min. or higher

2. Conformation of Solubility of Oxide

Indium-zinc-tin-oxide (IZTO) was dissolved in each of the liquid etching compositions shown in Tables 1 and 2 so as to have a predetermined concentration (zinc concentration of 10, 100 or 1000 ppm by mass), and presence/absence of non-dissolved substances was visually observed. The result was evaluated by the following criteria. The liquid etching composition evaluated as E, G or F was determined to pass the test.

E: IZTO having a zinc concentration of 1000 ppm by mass was added and was completely dissolved.

G: IZTO having a zinc concentration of 100 ppm by mass was added and was completely dissolved.

F: IZTO having a zinc concentration of 10 ppm by mass was added and was completely dissolved.

P: IZTO having a zinc concentration of 10 ppm by mass was added and non-dissolved substances were observed.

3. Measurement of Etching Rate Change after Dissolution of Oxide

Indium-zinc-tin-oxide (IZTO) was dissolved in each of the liquid etching compositions shown in Tables 1 and 2 so as to have a zinc concentration of 1000 ppm by mass, and then the etching rate was measured by the same method as in evaluation 1 above. The change in the etching rate after IZTO was dissolved was calculated. The result was evaluated by the following criteria. The liquid etching composition evaluated as E or G was determined to pass the test.

E: etching rate change: 5 nm/min. or less
G: etching rate change: more than 5 nm/min. and 10 nm/min. or less
P: etching rate change: more than 10 nm/min.

4. Evaluation on Residue Removal Property

An indium-zinc-tin-oxide (IZTO) thin film (thickness: 50 nm) was etched with each of the liquid etching compositions shown in Tables 1 and 2 in substantially the same manner as in evaluation 1 above (35° C.). The etching time duration was twice as long as the time duration required for etching (just etching time duration) (namely, the etching was performed under the 100% over-etching condition). The just etching time duration was calculated by dividing the thickness of the IZTO film by the etching rate found in evaluation 1 above (in example 1 described below, the just etching time duration=IZTO thickness 50 [nm]/etching rate 30 [nm/min]=1.667 [min]=100 seconds; therefore, the etching time duration under the 100% over-etching condition was 100 seconds×2=200 seconds). After the etching, the substrate was washed with water and dried by blowing nitrogen gas, and then was observed with a scanning electron microscope (model: S5000H; produced by Hitachi High-Technologies Corporation). The result was evaluated by the following criteria. The liquid etching composition evaluated as E or G was determined to pass the test.

E: There is no residue.
G: There is a very small amount of residue.
P: There is a large amount of residue.

5. Measurement of Etching Rate on Wiring Materials (Corrosiveness)

A copper (Cu)/titanium (Ti) stack film, an aluminum (Al) single layer film, a molybdenum (Mo) single layer film and a Ti single layer film each formed by sputtering on a glass substrate were used to measure the etching rate on Cu, Al, Mo and Ti by each of the liquid etching compositions shown in Tables 1 and 2. The etching process was performed by immersing each metal film/glass substrate in the liquid etching composition kept at 35° C. The thickness of the metal film was measured before and after the etching process by use of a fluorescent X-ray analysis device, SEA1200VX (produced by Seiko Instruments Inc.). The difference between the thickness before the etching process and the thickness after the etching process was divided by the etching time duration to find the etching rate. The result was evaluated by the following criteria. The liquid etching composition evaluated as E or G was determined to pass the test.

E: etching rate: lower than 1 nm/min.
G: etching rate: 1 nm/min.-lower than 2 nm/min.
P: etching rate: 2 nm/min. or higher Example 1

10.0 g of 50% sulfuric acid (produced by Wako Pure Chemical Industries, Ltd.) as component (A) and 90.0 g of pure water were put into a polypropylene container having a volume of 100 ml. The sulfuric acid and the pure water were stirred to prepare a liquid etching composition (total weight: 100.0 g). The content of sulfuric acid in the obtained liquid etching composition was 5.0% by mass. The pH value was 0.5.

The liquid etching composition was used to perform evaluations 1 through 4 above. The results are shown in Table 1. The etching rate was 30 nm/min., which was evaluated as E.

770 ppm by mass of IZTO (zinc concentration: 100 ppm by mass) as component (D) was dissolved in the liquid etching composition. The etching rate of the resultant solution was 29 nm/min. The change in the etching rate was small (decreased by 1 nm/min.), which was evaluated as E. Even when 7700 ppm by mass of IZTO (zinc concentration: 1000 ppm by mass) was further added, the liquid was transparent and there was no non-dissolved substances (evaluation result: E). After 7700 ppm by mass of IZTO (zinc concentration: 1000 ppm by mass) was added, the pH value was 0.5 and the etching rate was 28 nm/min. The change in the etching rate was small (decreased by 2 nm/min.), which was evaluated as E.

The etching rates on the wiring materials by the liquid etching composition were evaluated as G for Cu and Al and evaluated as E for Mo and Ti.

Example 2

10.0 g of 50% sulfuric acid (produced by Wako Pure Chemical Industries, Ltd.) as component (A) and 79.9 g of pure water were put into a polypropylene container having a volume of 100 ml. 10.0 g of 50% aqueous solution of citric acid (produced by Fuso Chemical Co., Ltd.) as component (B) and 0.1 g of LAVELIN FP (produced by Dai-ichi Kogyo Seiyaku Kabushiki Kaisha; pale yellow powder) as component (C) were further added. These substances were stirred and well mixed to prepare a liquid etching composition (total weight: 100.0 g). The content of sulfuric acid in the obtained liquid etching composition was 5.0% by mass. The content of citric acid was 5.0% by mass, and the content of LAVELIN FP was 0.1% by mass. The pH value was 0.4. The liquid etching composition was used to perform evaluations 1 through 4 above in substantially the same manner as in example 1. The results are shown in Table 1.

Example 3

20.0 g of 50% sulfuric acid (produced by Wako Pure Chemical Industries, Ltd.) as component (A) and 78.3 g of pure water were put into a polypropylene container having a volume of 100 ml. 1.7 g of oxalic acid (produced by Wako Pure Chemical Industries, Ltd.) as component (B) was further added. These substances were stirred and well mixed to prepare a liquid etching composition (total weight: 100.0 g). The content of sulfuric acid in the obtained liquid etching composition was 10.0% by mass, and the content of oxalic acid was 1.7% by mass. The pH value was 0.1. The liquid etching composition was used to perform evaluations 1 through 4 above in substantially the same manner as in example 1. The results are shown in Table 1.

Comparative Example 1

A liquid etching composition was prepared so as to contain hydrochloric acid at a concentration of 10.0% by mass. The liquid etching composition was used to perform evaluations 1 through 4 above in substantially the same manner as in example 1. The results are shown in Table 2.

Comparative Example 2

A liquid etching composition was prepared so as to contain oxalic acid at a concentration of 3.4% by mass. The liquid etching composition was used to perform evaluations 1 through 4 above. The results are shown in Table 2.

It is seen from examples 1 through 3 that a liquid etching composition according to the present invention etches an oxide containing indium, zinc, tin and oxygen at a preferable etching rate, without the etching rate being changed much along with the dissolution of the oxide, and with no generation of deposit. Thus, the liquid etching composition according to the present invention can etch an oxide containing indium, zinc, tin and oxygen. In addition, a liquid etching composition according to the present invention does not corrode wiring materials much. Thus, it has been found that a liquid etching composition according to the present invention has superb characteristics for use in industrial production.

By contrast, the liquid etching composition in comparative example 1 was relatively good in the etching rate and the solubility, but corroded Al and Cu as the wiring materials. The liquid etching composition in comparative example 2 was low in the solubility of IZTO (a zinc concentration of merely 10 ppm by mass was dissolved). It was impossible to evaluate the change in the etching rate.

TABLE 1

| Ex. | Component (A) | Component (B) | Component (C) | Component (D) | pH | Etching rate [nm/min] | Etching rate evaluation | Etching rate change | Solubility | Residue removal property | Corrosiveness on wiring material | | | |
|---|---|---|---|---|---|---|---|---|---|---|---|---|---|---|
| | | | | | | | | | | | Cu | Mo | Al | Ti |
| 1 | Sulfuric acid 5.0% | — | — | — | 0.5 | 30 | E | E | E | G | G | E | G | E |
| | | | | IZTO (zinc concentration of 100 ppm) | 0.4 | 29 | G | | | | | | | |
| | | | | IZTO (zinc concentration of 1000 ppm) | 0.5 | 28 | | | | | | | | |
| 2 | Sulfuric acid 5.0% | Citric acid 5.0% | LAVELIN FP 0.1% | — | 0.4 | 24 | G | E | E | E | E | E | E | E |
| | | | | IZTO (zinc concentration of 100 ppm) | 0.4 | 24 | | | | | | | | |
| | | | | IZTO (zinc concentration of 1000 ppm) | 0.4 | 24 | | | | | | | | |
| | | | | IZTO (zinc concentration of 3000 ppm) | 0.4 | 24 | | | | | | | | |
| 3 | Sulfuric acid 10.0% | Oxalic acid 1.7% | — | — | 0.1 | 45 | E | E | E | G | E | E | E | E |
| | | | | IZTO (zinc concentration of 100 ppm) | 0.1 | 43 | | | | | | | | |
| | | | | IZTO (zinc concentration 1000 ppm) | 0.1 | 41 | | | | | | | | |

—: Not added
E: Excellent
G: Good
F: Fair
P: Poor

TABLE 2

| Comparative ex. | Component (A) | Component (B) | Component (C) | Component (D) | pH | Etching rate [nm/min] | Etching rate evaluation | Etching rate change | Solubility | Residue removal property | Corrosiveness on wiring material | | | |
|---|---|---|---|---|---|---|---|---|---|---|---|---|---|---|
| | | | | | | | | | | | Cu | Mo | Al | Ti |
| 1 | Hydrochloric acid 10% | — | — | — | −0.4 | 254 | G | P | E | G | G | E | P | E |
| | | | | IZTO (zinc concentration of 100 ppm) | −0.4 | 248 | | | | | | | | |
| | | | | IZTO (zinc concentration 1000 ppm) | −0.4 | 235 | | | | | | | | |
| 2 | — | Oxalic acid 3.4% | — | — | 1.0 | 52 | E | — | P | — | E | E | E | E |

—: Not added or not performed
E: Excellent
G: Good
F: Fair
P: Poor

INDUSTRIAL APPLICABILITY

The liquid etching composition according to the present invention etches an oxide containing indium, zinc, tin and oxygen at a preferable etching rate, without the etching rate being changed much along with the dissolution of the oxide, and with no generation of deposit, and does not corrode wiring materials much. The liquid etching composition according to the present invention is expected to have a long life as a liquid chemical and thus is highly advantageous in reducing the cost thereof and decreasing the environmental load.

The invention claimed is:

1. A liquid etching composition for etching an oxide comprising indium, zinc, tin and oxygen, the liquid etching composition comprising:
   (A) at least one selected from the group consisting of sulfuric acid, methanesulfonic acid, and a salt of any of these acids;
   10 to 5000 ppm by mass of (D) zinc; and
   water;
   the liquid etching composition having a pH value of −0.5 to 1.

2. The liquid etching composition according to claim 1, further comprising (B) carboxylic acid.

3. The liquid etching composition according to claim 2, wherein the (B) carboxylic acid is at least one selected from the group consisting of oxalic acid, acetic acid, glycolic acid, malonic acid, maleic acid, succinic acid, malic acid, tartaric acid, glycine, and citric acid.

4. The liquid etching composition according to claim 1, further comprising a (C) polysulfonic acid compound.

5. The liquid etching composition according to claim 4, wherein the (C) polysulfonic acid compound is at least one selected from the group consisting of formalin condensate of naphthalenesulfonic acid, a salt thereof, polyoxyethylene-alkylethersulfuric acid, and polyoxyethylenealkylphenylethersulfuric acid.

6. A method for etching an oxide comprising indium, zinc, tin and oxygen, the method comprising putting a liquid etching composition into contact with a substrate provided with an oxide comprising indium, zinc, tin and oxygen, the liquid etching composition comprising 0.5 to 30% by mass of (A) at least one selected from the group consisting of sulfuric acid, methanesulfonic acid, and a salt of any of these acids, 10 to 5000 ppm by mass of (D) zinc, and water (remaining part), the liquid etching composition having a pH value of −0.5 to 1.

7. The method for etching according to claim 6, wherein the liquid etching composition further contains 0.1 to 15% by mass of (B) carboxylic acid.

8. The method for etching according to claim 6, wherein the liquid etching composition further contains 0.0001 to 10% by mass of (C) polysulfonic acid compound.

9. A method for producing a display device comprising etching an oxide comprising indium, zinc, tin and oxygen by the method according to claim 6.

* * * * *